United States Patent
Siva et al.

(10) Patent No.: US 12,078,676 B1
(45) Date of Patent: Sep. 3, 2024

(54) SYSTEM AND METHOD FOR DEVICE UNDER TEST (DUT) VALIDATION REUSE ACROSS MULTIPLE PLATFORMS

(71) Applicant: Marvell Asia Pte Ltd, Singapore (SG)

(72) Inventors: Nimalan Siva, San Ramon, CA (US); Pratik Shah, Newark, CA (US); Nikita Goyal, Santa Clara, CA (US); Ankit Anand, Newark, CA (US)

(73) Assignee: Marvell Asia Pte Ltd, Singapore (SG)

(*) Notice: Subject to any disclaimer, the term of this patent is extended or adjusted under 35 U.S.C. 154(b) by 28 days.

(21) Appl. No.: 18/102,620

(22) Filed: Jan. 27, 2023

Related U.S. Application Data

(60) Provisional application No. 63/406,770, filed on Sep. 15, 2022.

(51) Int. Cl.
- *G01R 31/317* (2006.01)
- *G01R 31/3183* (2006.01)
- *G06N 20/00* (2019.01)

(52) U.S. Cl.
CPC ........ *G01R 31/31704* (2013.01); *G01R 31/318357* (2013.01); *G06N 20/00* (2019.01)

(58) Field of Classification Search
CPC ...... G01R 31/31704; G01R 31/318357; G06F 30/33; G06F 30/367; G06F 11/3604; G06F 11/3608; G06N 20/00
See application file for complete search history.

(56) References Cited

U.S. PATENT DOCUMENTS

| | | | |
|---|---|---|---|
| 9,836,372 B1* | 12/2017 | Khan | G06F 11/3604 |
| 2021/0097431 A1* | 4/2021 | Olgiati | G06N 5/046 |
| 2021/0374580 A1* | 12/2021 | Hayes | G06F 21/56 |

* cited by examiner

Primary Examiner — Shelly A Chase

(57) ABSTRACT

A new approach is proposed to support device under test (DUT) validation reuse across a plurality of platforms, e.g., hardware simulation, hardware emulation, and post-silicon validation. First, an inference profile used for an inference operation of an application, e.g., a machine learning (ML) application, is generated based on a set of profile configurations, a set of test parameters, and a set of randomized constraints. A plurality of math functions specified by, e.g., an architecture team, for the ML application are also statically and/or dynamically verified via block simulation and/or formal verification. An inference model for the DUT is then built based on the inference profile and the plurality of verified math functions. Finally, an inference database including one or more of stimulus, DUT configurations, input data and predicted output results is generated based on the inference model, wherein the inference database for the DUT is reusable across the plurality of platforms.

29 Claims, 2 Drawing Sheets

SYSTEM AND METHOD FOR DEVICE UNDER TEST (DUT) VALIDATION REUSE ACROSS MULTIPLE PLATFORMS

CROSS-REFERENCE TO RELATED APPLICATIONS

This application claims the benefit of U.S. Provisional Patent Application No. 63/406,770, filed Sep. 15, 2022, which is incorporated herein in its entirety by reference.

BACKGROUND

An electronic device under testing (DUT), which, for a non-limiting example, can be but is not limited to an integrated circuit (IC), can be defined and specified using multiple instruction sets of a plurality of software instructions, e.g., source code and/or libraries in different languages on different platforms to serve different purposes. Here, the IC can be but is not limited to a processor such as CPU or GPU, or an application-specific IC (ASIC). For a non-limiting example, an instruction set in hardware specification language such as Verilog or Very High-Speed Integrated Circuit Hardware Description Language (VHDL) can be used to define and specify hardware of the DUT at resistor-transistor level (RTL). For another non-limiting example, another instruction set in design verification language such as System Verilog (SV) can be used to verify various functionalities of the DUT. For another non-limiting example, another instruction set in a programming language such as C++ can be used to simulate one or more testbenches of the DUT. For another non-limiting example, another instruction set in programming language such as C or C++ can be used for software to be complied and executed by the DUT. In some embodiments, each instruction set can be of any type of a high-level programming language. In some embodiments, each instruction set can be of any type of an intermediate level programming language.

In general, testing the DUT involves using a testbench that runs on a simulation tool to generate test results in order to determine whether components of the DUT of the component is operating as intended. In some instances, the testbench can provide a test environment for testing the DUT in isolation, thereby enabling direct control over input stimulus to the DUT. Currently, different teams generate their own stimulus across various platforms, including but not limited to, software simulation, hardware emulation, and post-silicon validation, which leads to each team reinventing the wheel and spending time on building its own platform rather than on validating the DUT. As a result, there is hardly any reusability of the DUT validation approaches across the various platforms.

The foregoing examples of the related art and limitations related therewith are intended to be illustrative and not exclusive. Other limitations of the related art will become apparent upon a reading of the specification and a study of the drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
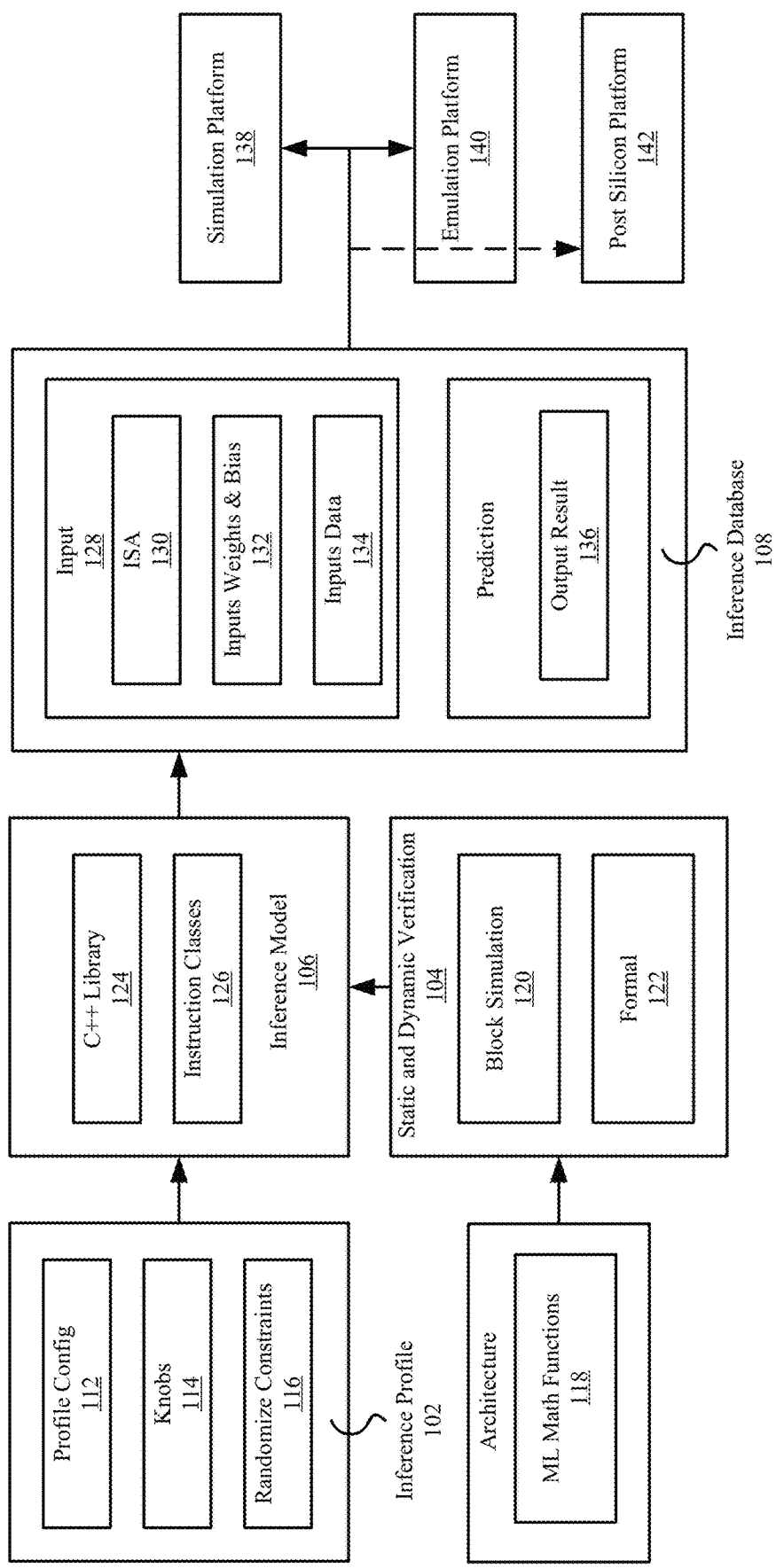
FIG. 1 depicts an example of a diagram to support DUT validation reuse across multiple platforms according to an aspect of a present embodiment.

The following disclosure provides many different embodiments, or examples, for implementing different features of the subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

A new approach is proposed to support DUT validation reuse across a plurality of platforms, which include but are not limited to e.g., hardware simulation, hardware emulation, and post-silicon validation. First, an inference profile used for an inference operation of an application, e.g., a machine learning (ML) application, is generated based on a set of profile configurations, a set of test parameters, and a set of randomized constraints. A plurality of math functions specified by, e.g., an architecture team, for the ML application are also statically and/or dynamically verified via block simulation and/or formal verification. An inference model for the DUT is then built based on the inference profile and the plurality of verified math functions. Finally, an inference database including one or more of stimulus, DUT configurations, input data and predicted output results is generated based on the inference model, wherein the inference database for the DUT is reusable across the plurality of platforms.

The proposed approach provides a unified software/compiler independent end-to-end ML verification infrastructure that is reusable among the various validation platforms to reduce redundancy across the platforms. Such verification infrastructure offers a unique ability to solve issues related to stimulus, DUT configuration, input data, and prediction of output data all at once. As a result, post-silicon DUT issues can be debugged quickly and easily by reproducing the issues at simulation and/or emulation platforms, which leads to rapid convergence from block level to full chip simulation and emulation.

FIG. 1 depicts an example of a diagram of a system 100 to support DUT validation reuse across a plurality of platforms. Although the diagrams depict components as functionally separate, such depiction is merely for illustrative purposes. It will be apparent that the components portrayed in this figure can be arbitrarily combined or divided into separate software, firmware, and/or hardware components. Furthermore, it will also be apparent that such components, regardless of how they are combined or divided, can execute on the same host or a hosts, and wherein the multiple hosts can be connected by one or more networks.

In the example of FIG. 1, the system 100 includes at least an inference engine 102, a static and dynamic verification engine 104, an inference modelling engine 106 and an inference database 108. Each of these components in the system 100 runs on one or more computing units or devices (not shown) each having one or more processors and software instructions stored in a storage unit such as a nonvolatile memory of the computing unit for practicing one or more processes. When the software instructions are executed by the one or more processors, at least a subset of the software instructions is loaded into memory by one of the computing units, which becomes a special purposed one for practicing the processes. The processes may also be at least partially embodied in the computing units into which computer program code is loaded and/or executed, such that, the computing units become special purpose computing units for practicing the processes.

In the example of FIG. 1, the inference engine 102 is configured to generate an inference profile used for an inference operation of an ML application based on one or more of a set of profile configurations 112, a set of test case knobs 114, which are adjustable parameters or options, and a set of randomized constraints 116 for the ML application. In some embodiments, the inference engine 102 is configured to enable the set of one or more profile configurations 112 to be defined by a user and/or to include what type of compute resources are required to be utilized to run one or more ML models generated for the inference operation of the ML application to validate the DUT. For non-limiting examples, the ML models can be utilized by any inference operation including but not limited to image recognition of certain objects (e.g., person, dog etc.) and/or text recognition. In some embodiments, the inference engine 102 is configured to enable the set of one or more test case knobs 114 to be controlled and chosen by the user for a particular ML model for the ML application. In some embodiments, the inference engine 102 is configured to generate the set of randomized constraints 116 by randomizing all possible parameters or a subset thereof across one or more of an instruction set describing/characterizing the ML model, datatypes for one or more math functions of the ML model, and range of values (e.g., min, max) for the ML model, wherein the set of randomized constraints 116 is included as part of the inference database 108. By utilizing the set of test case knobs 102 used along with the set of randomized constraints 116, the inference engine 102 makes sure that the generated inference profile covers an entire sample space of a wide variety of stimulus and input data ranges, for simulation, emulation and post-silicon platform testing of the DUT.

In some embodiments, the instruction set for the ML model is specified in the format of instruction set architecture (ISA) designed for, for a non-limiting example, a specialized ML hardware and/or efficient data processing for the ML application. In some embodiments, the ISA may cover one or more of different addressing modes, native data types, registers, memory architectures, and interrupts. In some embodiments, the ISA is a predominantly asynchronous instruction set, wherein each instruction in the ISA format programs a state-machine, which then runs asynchronously with respect to other state machines. In some embodiments, the ISA provides separate synchronizing instructions to ensure order between instructions where needed. In some embodiments, when being executed on an ML hardware, the first instruction set in the ISA format is configured to perform one or more of: (i) programming one or more input data streams to the ML hardware; (ii) programming one or more operations to be performed on the input data streams; and (iii) programming one or more output data streams from the ML hardware.

In some embodiments, the inference profile generated by the inference engine 102 is based on a hardware verification language such as SV Universal Verification Methodology (UVM), wherein UVM is a standardized methodology for verifying IC designs to enable faster development and reuse of verification environments. In some embodiments, the inference profile in SV UVM can be utilized to validate complex DUT features with its ability to solve the set of randomized constraints.

In the example of FIG. 1, the static and dynamic verification engine 104 is configured to accept and verify a plurality of math functions 118 statically and/or dynamically to identify any potential DUT issues, wherein the plurality of math functions 118 can be specified by, e.g., a team of architect of the DUT, for implementing the ML application. For non-limiting examples, the set of math functions 118 can include but are not limited to, addition, subtraction, multiplication, and division operations across various datatypes including but not limited to Integer and Floating Points etc. In some embodiments, the static and dynamic verification engine 104 is configured to verify the plurality of math functions via a block simulation component 120, which simulates each of the plurality of math functions as a functional block one block at a time to verify functionalities of the plurality of math functions 118 at the RTL level. In some embodiments, the static and dynamic verification engine 104 is configured to verify the plurality of math functions via a formal verification component 122, which verifies correctness of the plurality of math functions used for implementing the ML application 118 using formal mathematical proofs or models. The plurality of verified math functions can then be reused to generate a predicted output result 136 for a given input data 134, wherein the predicted output result 136 is compared against an actual output result from the DUT to validate functionalities of the DUT.

In the example of FIG. 1, the inference modelling engine 106 is configured to build/create an inference model based on the inference profile and the plurality of verified math functions, wherein the inference model is re-used to validate the DUT across various platforms. In some embodiments, the inference model includes a programming language library, which can be but is not limited to a C or C++ library 124, wherein the programming language library integrates the plurality of verified math functions as high-level abstract functions for the ML application. In some embodiments, the inference model engine 106 is configured to utilize the inference profile to generate one or more input weights and bias for the ML model. Here, the one or more input weights and bias for the one or more ML models are utilized to run the inference operation for the ML application to validate the DUT. In some embodiments, the inference model includes a set of instruction classes 126, which a library of all instructions in the instruction set for the ML application in, e.g., ISA format. In some embodiments, a subset of these instructions is combined to create a meaningful ML model for the ML application, e.g., addition, matrix multiplication, etc., which, in some embodiments, may invoke the plurality of verified math functions 118 in the programming language library.

In the example of FIG. 1, the inference database 108 is generated from the inference model, wherein the inference database 108 is reusable across different platforms including but not limited to simulation 138, emulation 140, and post-silicon validation 142, for DUT validation. In some embodiments, the inference database 108 includes two portions—an input portion 128 for the ML model and an output portion 136 of the ML model. In some embodiments, the input portion 128 of the inference database 108 comprises three types of data set—the instruction set 130 for the ML model, the one or more input weights and bias 132 for the ML model, and input data 134 including one or more of the inference profile, the set of randomized constraints, DUT configuration, and stimulus to the ML model, e.g., an image having one or more objects or texts to be recognized via the inference operation. The output portion of the inference database 108 includes a predicted output result 136 generated based on the inference model. Here, the predicted output result 136 of the inference operation can be generated by reusing the plurality of verified math functions 118 and compared against an actual output result from the DUT to validate one or more functionalities of the DUT. In some embodiments, inference database 108 thus includes data in an generic format, wherein such integrated inference database 108 can be vertically reused across different validation platforms including but not limited to simulation 138, emulation 140, and post-silicon validation 142.

Figure 2:
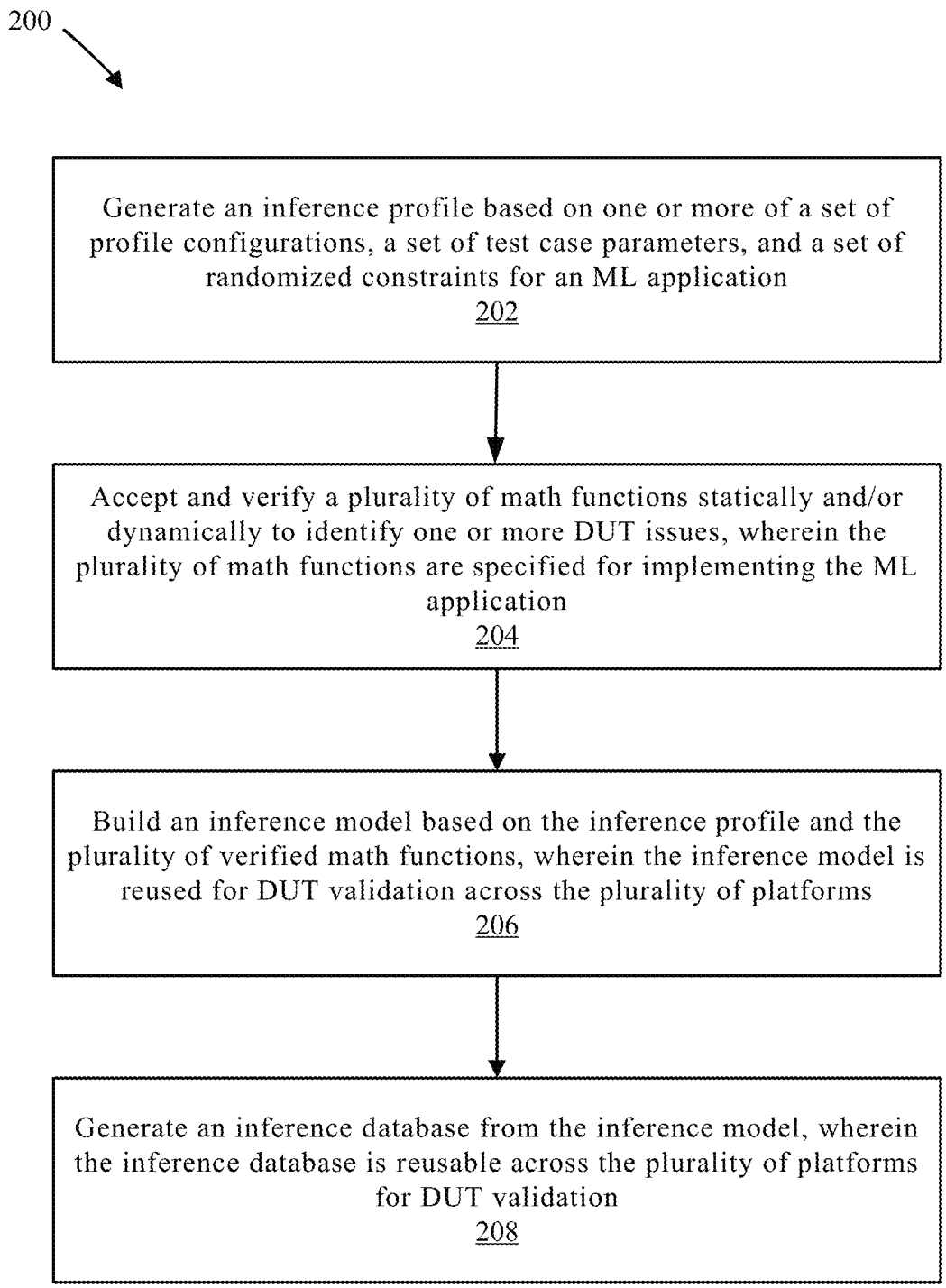
FIG. 2 depicts a flowchart of an example of a process to support DUT validation reuse across multiple platforms according to an aspect of a present embodiment.

FIG. 2 depicts a flowchart 200 of an example of a process to support DUT validation reuse across a plurality of platforms. Although the figure depicts functional steps in a particular order for purposes of illustration, the processes are not limited to any particular order or arrangement of steps. One skilled in the relevant art will appreciate that the various steps portrayed in this figure could be omitted, rearranged, combined and/or adapted in various ways.

In the example of FIG. 2, the flowchart 200 starts at block 202, where an inference profile is generated based on one or more of a set of profile configurations, a set of test parameters, and a set of randomized constraints for an ML application. The flowchart 200 continues to block 204, where a plurality of math functions are accepted and verified statically and/or dynamically to identify one or more DUT issues, wherein the plurality of math functions are specified for implementing the ML application. The flowchart 200 continues to block 206, where an inference model is built based on the inference profile and the plurality of verified math functions, wherein the inference model is reused for DUT validation across multiple platforms. The flowchart 200 ends at block 208, where an inference database is generated from the inference model, wherein the inference database is reusable across the plurality of platforms for DUT validation.

The foregoing description of various embodiments of the claimed subject matter has been provided for the purposes of illustration and description. It is not intended to be exhaustive or to limit the claimed subject matter to the precise forms disclosed. Many modifications and variations will be apparent to the practitioner skilled in the art. Embodiments were chosen and described in order to best describe the principles of the invention and its practical application, thereby enabling others skilled in the relevant art to understand the claimed subject matter, the various embodiments and the various modifications that are suited to the particular use contemplated.

What is claimed is:

1. A system to support device under test (DUT) validation reuse across a plurality of platforms, comprising:
    an inference engine configured to generate an inference profile used for an inference operation of a machine learning (ML) application based on one or more of a set of profile configurations, a set of test parameters, and a set of randomized constraints for the ML application;
    a static and dynamic verification engine configured to accept and verify a plurality of math functions statically and/or dynamically to identify one or more DUT issues, wherein the plurality of math functions are specified for implementing the ML application;
    an inference modelling engine configured to build an inference model based on the inference profile and the plurality of verified math functions, wherein the inference model is reused for DUT validation across the plurality of platforms.

2. The system of claim 1, further comprising:
an inference database generated from the inference model, wherein the inference database is reusable across the plurality of platforms for DUT validation.

3. The system of claim 1, wherein:
the plurality of platforms include one or more of hardware simulation, hardware emulation, and post-silicon validation.

4. The system of claim 1, wherein:
the inference profile is based on a System Verilog (SV) Universal Verification Methodology (UVM).

5. The system of claim 2, wherein:
the set of one or more profile configurations includes compute resource types to run a ML model generated for an inference operation of the ML application to validate the DUT.

6. The system of claim 5, wherein:
the set of one or more test parameters are adjustable parameter or options controlled and chosen by a user for the ML model for the ML application.

7. The system of claim 5, wherein:
the inference engine is configured to generate the set of randomized constraints by randomizing a set of parameters across one or more of an instruction set for the ML model, datatypes for one or more math functions of the ML model, and range of values for the ML model.

8. The system of claim 7, wherein:
the instruction set for the ML model is specified in the format of instruction set architecture (ISA) designed for ML hardware and/or data processing for the ML application.

9. The system of claim 1, wherein:
the static and dynamic verification engine is configured to verify the plurality of math functions via block simulation, which simulates each of the plurality of math functions as a functional block one block at a time to verify functionalities of the plurality of math functions at resistor-transistor level (RTL).

10. The system of claim 1, wherein:
the static and dynamic verification engine is configured to verify the plurality of math functions via formal verification, which verifies correctness of the plurality of math functions used for implementing the ML application using formal mathematical proofs or models.

11. The system of claim 5, wherein:
the inference model includes a programming language library, wherein the programming language library integrates the plurality of verified math functions as high level abstract functions for the ML application.

12. The system of claim 11, wherein:
the inference model includes instructions in the instruction set for the ML application.

13. The system of claim 12, wherein:
a subset of the instructions in the instruction set is combined to create the ML model for the ML application, which invokes the plurality of verified math functions in the programming language library.

14. The system of claim 13, wherein:
the inference model engine is configured to utilize the inference profile to generate one or more input weights and bias for the ML model.

15. The system of claim 14, wherein:
the inference database includes two portions—an input portion for the ML model and an output portion of the ML model.

16. The system of claim 15, wherein:
the input portion of the inference database comprises three types of data set—the instruction set for the ML model, the one or more input weights and bias for the ML model, and input data including one or more of the inference profile, the set of randomized constraints, DUT configuration, and stimulus to the ML model.

17. The system of claim 15, wherein:
the output portion of the inference database includes a predicted output result generated based on the inference model, wherein the predicted output result is compared against an actual output result for DUT validation.

18. A method to support device under test (DUT) validation reuse across a plurality of platforms, comprising:
generating an inference profile used for an inference operation of a machine learning (ML) application based on one or more of a set of profile configurations, a set of test parameters, and a set of randomized constraints for the ML application;
accepting and verifying a plurality of math functions statically and/or dynamically to identify one or more DUT issues, wherein the plurality of math functions are specified for implementing the ML application;
building an inference model based on the inference profile and the plurality of verified math functions, wherein the inference model is reused for DUT validation across the plurality of platforms.

19. The method of claim 18, further comprising:
generating an inference database from the inference model, wherein the inference database is reusable across the plurality of platforms for DUT validation.

20. The method of claim 19, further comprising:
generating the set of randomized constraints by randomizing a set of parameters across one or more of an instruction set for a ML model of the ML application, datatypes for one or more math functions of the ML model, and range of values for the ML model.

21. The method of claim 20, further comprising:
combining a subset of the instructions in the instruction set to create the ML model of the ML application, which invokes the plurality of verified math functions in the programming language library.

22. The method of claim 18, further comprising:
verifying the plurality of math functions via block simulation, which simulates each of the plurality of math functions as a functional block one block at a time to verify functionalities of the plurality of math functions at resistor-transistor level (RTL).

23. The method of claim 18, further comprising:
verifying the plurality of math functions via formal verification, which verifies correctness of the plurality of math functions used for implementing the ML application using formal mathematical proofs or models.

24. The method of claim 18, further comprising:
integrating the plurality of verified math functions in a programming language library as high level abstract functions for the ML application in the inference model.

25. The method of claim 20, further comprising:
utilizing the inference profile to generate one or more input weights and bias for the ML model.

26. The method of claim 20, further comprising:
including two portions in the inference database—an input portion for the ML model and an output portion of the ML model.

27. The method of claim 26, wherein:
the input portion of the inference database comprises three types of data set—the instruction set for the ML model, the one or more input weights and bias for the ML model, and input data including one or more of the inference profile, the set of randomized constraints, DUT configuration, and stimulus to the ML model.

28. The method of claim 26, wherein:
the output portion of the inference database includes a predicted output result generated based on the inference model, wherein the predicted output result is compared against an actual output result for DUT validation.

29. A system to support device under test (DUT) validation reuse across a plurality of platforms, comprising:
a means for generating an inference profile used for an inference operation of a machine learning (ML) application based on one or more of a set of profile configurations, a set of test parameters, and a set of randomized constraints for the ML application;
a means for accepting and verifying a plurality of math functions statically and/or dynamically to identify one or more DUT issues, wherein the plurality of math functions are specified for implementing the ML application;
a means for building an inference model based on the inference profile and the plurality of verified math functions, wherein the inference model is reused for DUT validation across the plurality of platforms.

* * * * *